United States Patent
Nakamura et al.

(10) Patent No.: US 9,296,659 B2
(45) Date of Patent: Mar. 29, 2016

(54) FERRITE CERAMIC COMPOSITION, CERAMIC ELECTRONIC COMPONENT, AND METHOD FOR MANUFACTURING CERAMIC ELECTRONIC COMPONENT

(71) Applicant: MURATA MANUFACTURING CO., LTD., Kyoto-fu (JP)

(72) Inventors: Akihiro Nakamura, Kyoto (JP); Atsushi Yamamoto, Kyoto (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 14/192,659

(22) Filed: Feb. 27, 2014

(65) Prior Publication Data

US 2014/0176285 A1 Jun. 26, 2014

Related U.S. Application Data

(63) Continuation of application No. PCT/JP2012/072135, filed on Aug. 31, 2012.

(30) Foreign Application Priority Data

Sep. 2, 2011 (JP) .................... 2011-192024

(51) Int. Cl.
*H01F 5/00* (2006.01)
*H01F 27/28* (2006.01)
(Continued)

(52) U.S. Cl.
CPC ........ *C04B 35/2625* (2013.01); *C01G 49/0063* (2013.01); *C01G 49/0072* (2013.01);
(Continued)

(58) Field of Classification Search
CPC .................................. H01F 5/00; H01F 27/28
USPC ................................................. 336/200, 232
See application file for complete search history.

(56) References Cited

U.S. PATENT DOCUMENTS 3,055,833 A 9/1962 Baltzer
2003/0102951 A1* 6/2003 Nakano et al. ................ 336/200
(Continued)

FOREIGN PATENT DOCUMENTS

JP 35-009226 B1 7/1960
JP H01-212234 A 8/1989
(Continued)

OTHER PUBLICATIONS

The First Office Action issued by the State Intellectual Property Office of the People's Republic of China on Oct. 24, 2014, which corresponds to Chinese Patent Application No. 201280042562.1 and is related to U.S. Appl. No. 14/192,659; with English language translation.

(Continued)

*Primary Examiner* — Tsz Chan
(74) *Attorney, Agent, or Firm* — Studebaker & Brackett PC

(57) ABSTRACT

A ceramic electronic component includes a magnetic section composed of a ferrite material and a coil conductor containing Cu as its main constituent. The magnetic section is formed from Ni—Cu—Zn ferrite which falls within the range specified by (x, y)=A (25, 1), B (47, 1), C (47, 7.5), D (46, 7.5), E (46, 10), F (30, 10), G (30, 7.5), and H (25, 7.5) when the molar content x of $Fe_2O_3$ and the molar content y of $Mn_2O_3$ are represented by (x, y). A CuO molar content of 0.5 to 10.0 mol %, a ZnO content of 1.0 to 35.0 mol %, a MgO content of 5.0 to 35.0 mol %, and NiO as the balance is present. Even when co-firing with a conductive material containing Cu as its main constituent, insulation properties are ensured, favorable electrical properties are achieved, and a ceramic electronic component is achieved.

6 Claims, 4 Drawing Sheets

(51) Int. Cl.
　　　*H01F 7/06*　　　(2006.01)
　　　*C04B 35/26*　　(2006.01)
　　　*H01F 17/00*　　(2006.01)
　　　*H01F 27/29*　　(2006.01)
　　　*H01F 41/02*　　(2006.01)
　　　*C01G 49/00*　　(2006.01)
　　　*H01F 1/34*　　　(2006.01)
　　　*H05K 3/00*　　　(2006.01)
　　　*C01G 53/00*　　(2006.01)
　　　*H01F 3/08*　　　(2006.01)

(52) U.S. Cl.
　　　CPC .............. *C01G53/40* (2013.01); *C04B 35/265* (2013.01); *H01F 1/344* (2013.01); *H01F 3/08* (2013.01); *H01F 17/0013* (2013.01); *H01F 27/2804* (2013.01); *H01F 27/292* (2013.01); *H01F 41/0246* (2013.01); *H05K 3/0058* (2013.01); *C01P 2002/32* (2013.01); *C01P 2002/52* (2013.01); *C04B 2235/3206* (2013.01); *C04B 2235/3265* (2013.01); *C04B 2235/3272* (2013.01); *C04B 2235/3279* (2013.01); *C04B 2235/3281* (2013.01); *C04B 2235/3284* (2013.01); *C04B 2235/6025* (2013.01); *C04B 2235/6584* (2013.01); *H01F 2017/0066* (2013.01); *Y10T 29/49155* (2015.01)

(56) References Cited

U.S. PATENT DOCUMENTS

| 2011/0037557 | A1* | 2/2011 | Konoue et al. | 336/200 |
| 2011/0074537 | A1* | 3/2011 | Nakatsuji | 336/200 |
| 2012/0297610 | A1 | 11/2012 | Yamamoto et al. | |

FOREIGN PATENT DOCUMENTS

| JP | 04-061203 A | | 2/1992 |
| JP | 04-325458 A | | 11/1992 |
| JP | 2002-087877 A | | 3/2002 |
| JP | 2002-193623 A | | 7/2002 |
| JP | 2010018482 A | * | 1/2010 |
| JP | 2010-235324 A | | 10/2010 |
| JP | 2010235324 A | * | 10/2010 |
| JP | 2010278075 A | * | 12/2010 |
| WO | 2011/093489 A1 | | 8/2011 |

OTHER PUBLICATIONS

International Search Report; PCT/JP2012/072135; Dec. 11, 2012.
Written Opinion of the International Searching Authority; PCT/JP2012/072135; Dec. 11, 2012.

* cited by examiner

US 9,296,659 B2

FERRITE CERAMIC COMPOSITION, CERAMIC ELECTRONIC COMPONENT, AND METHOD FOR MANUFACTURING CERAMIC ELECTRONIC COMPONENT

CROSS REFERENCE TO RELATED APPLICATIONS

This application claims benefit of priority to Japanese Patent Application No. 2011-192024 filed on Sep. 2, 2011, and to International Patent Application No. PCT/JP2012/072135 filed on Aug. 31, 2012, the entire content of each of which is incorporated herein by reference.

TECHNICAL FIELD

The present technical field relates to a ferrite ceramic composition, a ceramic electronic component, and a method for manufacturing a ceramic electronic component, and more particularly, relates to a ferrite ceramic composition capable of co-firing with a conductive material containing Cu as its main constituent, a ceramic electronic component such as a coil component with the use of the ferrite ceramic composition, and a method for manufacturing the ceramic electronic component.

BACKGROUND

In recent years, ceramic electronic components have been widely used which use ferrite ceramics with a spinel-type crystal structure such as Ni—Cu—Zn, and the development of ferrite materials has been also actively carried out.

For example, JP 2002-193623 A proposes a magnetic ferrite material containing, as its main constituents, $Fe_2O_3$: 40.0 to 51.0 mol %, CuO: 5.0 to 30.0 mol %, ZnO: 0.5 to 35.0 mol %, and MgO+NiO: 5.0 to 50.0 mol % (MgO is essential), and containing, as its accessory constituents, Mn: 0.75 wt % or less (excluding 0) and Co: 0.75 wt % or less (excluding 0).

JP 2002-193623 A is intended to reduce the magnetostriction constant by substituting some expensive NiO with relatively inexpensive MgO, and to achieve a magnetic ferrite material that is excellent in voltage resistance and durability by Mn and Co within predetermined ranges.

In addition, JP 2002-193623 A also proposes a laminate-type ferrite component (laminated coil component) with the use of the magnetic ferrite material, and discloses, as internal electrode materials, low-resistance Ag, Ag alloys, Ag—Pd alloys, and the like which are preferably used, and Cu, Pd, etc. which can be also used, and discloses a laminated chip inductor array with the use of Ag for an internal electrode material.

SUMMARY

Problem to be Solved by the Disclosure

Ni—Cu—Zn ferrite is commonly subjected to firing in an air atmosphere, and, for example, in the case of a laminated coil component as in JP 2002-193623 A, typically, Ag is used for an internal electrode material. A ferrite material and the internal electrode material are subjected to co-firing at a low temperature 930° C. or lower.

However, the use of Ag for the internal electrode material of the laminated coil component is likely to cause migrations, and the use for a long period of time under high humidity has the possibility of decreasing insulation properties, thereby leading to decreased reliability. In particular, in the case of high-density packaging such as the laminate-type chip inductor array described in JP 2002-193623 A, the interval between internal electrodes is also reduced, and the use for applications with a potential difference produced between coils thus makes an abnormality likely to be caused by the generation of migrations, thereby making it difficult to ensure sufficient reliability.

In addition, in consideration of production cost, Pd and Ag—Pd are expensive, and inexpensive Cu is desirably used which is low in resistance and excellent in conductivity.

However, it is known that from the relationship between the equilibrium oxygen partial pressure of Cu—$Cu_2O$ and the equilibrium oxygen partial pressure of $Fe_2O_3$—$Fe_3O_4$, there is no region where Cu and $Fe_2O_3$ coexist at high temperatures of 800° C. or higher.

More specifically, at temperatures of 800° C. or higher, when firing is carried out with the oxygen partial pressure set in such an oxidizing atmosphere that maintains the state of $Fe_2O_3$, Cu is also oxidized to produce $Cu_2O$. On the other hand, when firing is carried out with the oxygen partial pressure set in such a reducing atmosphere that maintains the state of the Cu metal, $Fe_2O_3$ is reduced to produce $Fe_3O_4$.

As described above, there is no region where Cu and $Fe_2O_3$ coexist, and thus, firing in such a reducing atmosphere in which Cu is not oxidized reduces $Fe_2O_3$ to $Fe_3O_4$, thus decreasing the resistivity $\rho$, and for this reason, possibly leading to degradation of electrical properties.

The present disclosure has been achieved in view of these circumstances, and an object of the present disclosure is to provide a ferrite ceramic composition capable of ensuring insulation properties and achieving favorable electrical properties even when the material is subjected to co-firing with a conductive material containing Cu as its main constituent, a ceramic electronic component such as an inexpensive highly-reliable laminated coil component with the use of the ferrite ceramic composition, and a method for manufacturing the ceramic electronic component.

Means for Solving the Problem

The inventors have carried out earnest studies on ferrite materials of spinel-type crystal structures represented by the general formula $X_2O_3$-MeO (X is Fe or Mn, and Me is Zn, Cu, Mg, or Ni), and found that when the molar contents of Fe and Mn in terms of $Fe_2O_3$ and $Mn_2O_3$ respectively meet specific ranges, and when the molar contents of Cu and Zn in terms of CuO and ZnO are respectively limited to predetermined ranges, desired favorable insulation properties can be achieved even when some of the NiO is substituted with MgO in a predetermined range, thereby making it possible to achieve a ceramic electronic component with favorable electric properties even when the Cu material and the ferrite material are subjected to co-firing.

The present disclosure has been achieved on the basis of this finding, and a ferrite ceramic composition according to the present disclosure is a ferrite ceramic composition containing at least Fe, Mn, Cu, Zn, Mg, and Ni, which is characterized in that when the molar content x mol % of Fe in terms of $Fe_2O_3$ and the molar content y mol % of Mn in terms of $Mn_2O_3$ are represented by (x, y), (x, y) falls within the region surrounded by A (25, 1), B (47, 1), C (47, 7.5), D (46, 7.5), E (46, 10), F (30, 10), G (30, 7.5), and H (25, 7.5), the molar content of Cu is 0.5 to 10.0 mol % in terms of CuO, the content of Zn is 1.0 to 35.0 mol % in terms of ZnO, and the content of Mg is 5.0 to 35.0 mol % in terms of MgO.

Thus, a ferrite ceramic composition can be achieved which is capable of improving the resistivity $\rho$ and ensuring desired insulation properties, even when the composition is subjected to co-firing with a Cu material.

Furthermore, a ceramic electronic component according to the present disclosure includes a magnetic section composed of a ferrite material, and a conductive section containing Cu as its main constituent, and the component is characterized in that the magnetic section is formed from the ferrite ceramic composition mentioned above.

Thus, even in the case of co-firing with the Cu material, a ceramic electronic component can be achieved at low cost, which has desired favorable electrical properties.

In addition, the ceramic electronic component according to the present disclosure is preferably subjected to firing in an atmosphere at lower than or equal to the equilibrium oxygen partial pressure of $Cu-Cu_2O$.

Thus, a ceramic electronic component can be easily achieved which can be sintered without having Cu oxidized, and has favorable electrical properties, even when a conductive material containing Cu as its main constituent is used for a coil conductor, and subjected to co-firing with the magnetic section.

In addition, the ceramic electronic component according to the present disclosure preferably has the magnetic section and conductive section co-fired.

In addition, the ceramic electronic component according to the present disclosure preferably has the magnetic section and conductive section alternately stacked more than once.

In addition, the ceramic electronic component according to the present disclosure is preferably a laminated coil component.

Furthermore, a method for manufacturing a ceramic electronic component according to the present disclosure is characterized in that it includes a calcination step of weighing a Fe compound, a Mn compound, a Cu compound, a Mg compound, a Zn compound, and a Ni compound so that when the molar content x mol % of Fe in terms of $Fe_2O_3$ and the molar content y mol % of Mn in terms of $Mn_2O_3$ are represented by (x, y), (x, y) meets the region surrounded by A (25, 1), B (47, 1), C (47, 7.5), D (46, 7.5), E (46, 10), F (30, 10), G (30, 7.5), and H (25, 7.5), the molar content of Cu is 0.5 to 10.0 mol % in terms of CuO, the molar content of Zn is 1.0 to 35.0 mol % in terms of ZnO, and the molar content of Mg is 5.0 to 35.0 mol % in terms of MgO, and mixing and then calcining the weighed compounds to prepare a calcined powder. A ceramic thin-layer body preparation step includes preparing a ceramic thin-layer body from the calcined powder. A conductive film formation step includes forming, on the ceramic thin-layer body, a conductive film containing Cu as its main constituent in a predetermined pattern. A laminated body formation step includes forming a laminated body by stacking the ceramic thin-layer body with the conductive film formed in a predetermined order. A firing step includes firing the laminated body in a firing atmosphere at lower than or equal to the equilibrium oxygen partial pressure of $Cu-Cu_2O$ to co-fire the ceramic thin-layer body and the conductive film.

Thus, even when the ceramic thin-layer body and the conductive film containing Cu as its main constituent are subjected to co-firing in a firing atmosphere at lower than or equal to the equilibrium oxygen partial pressure of $Cu-Cu_2O$, a ceramic electronic component can be achieved which has favorable insulation properties and high reliability without having Fe reduced.

Advantageous Effect of the Disclosure

In the ferrite ceramic composition, when the molar content x mol % of Fe in terms of $Fe_2O_3$ and the molar content y mol % of Mn in terms of $Mn_2O_3$ are represented by (x, y), (x, y) falls within the specific range surrounded by the points A through H mentioned above, the molar content of Cu is 0.5 to 10.0 mol % in terms of CuO, the content of Mg is 5.0 to 35.0 mol % in terms of MgO, and the content of Zn is 1.0 to 35.0 mol % in terms of ZnO. Thus, even when the ferrite ceramic composition is subjected to co-firing with a Cu material, the resistivity ρ can be improved, and desired insulation properties can be ensured.

Specifically, favorable insulation properties can be achieved with the resistivity ρ of $10^7$ Ω·cm or more. Furthermore, this makes it possible to achieve a desired ceramic electronic component which has favorable electrical properties such as impedance characteristics.

Moreover, the relatively inexpensive Mg contained can reduce the molar content of expensive Ni, thus allowing a reduction in cost.

Furthermore, the ceramic electronic component according to the present disclosure includes the magnetic section composed of a ferrite material and the conductive section containing Cu as its main constituent, and the magnetic section is formed from the ferrite ceramic composition mentioned above. Thus, a ceramic electronic component can be achieved at low cost, which has desired favorable electrical properties even in the case of co-firing with the Cu material.

Moreover, it becomes possible to avoid migrations as in the case of Ag materials. Therefore, a ceramic electronic component can be achieved, such as a highly reliable laminated coil component which is capable of ensuring favorable insulation properties even when the component is left for a long period of time under high humidity.

Furthermore, the method for manufacturing a ceramic electronic component according to the present disclosure includes the calcination step of weighing a Fe compound, a Mn compound, a Cu compound, a Mg compound, a Zn compound, and a Ni compound so that when the molar content x mol % of Fe in terms of $Fe_2O_3$ and the molar content y mol % of Mn in terms of $Mn_2O_3$ are represented by (x, y), (x, y) meets the region surrounded by A (25, 1), B (47, 1), C (47, 7.5), D (46, 7.5), E (46, 10), F (30, 10), G (30, 7.5), and H (25, 7.5), the molar content of Cu is 0.5 to 10.0 mol % in terms of CuO, the molar content of Mg is 5.0 to 35.0 mol % in terms of MgO, and the molar content of Zn is 1.0 to 35.0 mol % in terms of ZnO, and mixing and then calcining the weighed compounds to prepare a calcined powder. The ceramic thin-layer body preparation step includes preparing a ceramic thin-layer body from the calcined powder. The conductive film formation step includes forming, on the ceramic thin-layer body, a conductive film containing Cu as its main constituent in a predetermined pattern. The laminated body formation step includes forming a laminated body by stacking the ceramic thin-layer body with the conductive film formed in a predetermined order. The firing step includes firing the laminated body in a firing atmosphere at lower than or equal to the equilibrium oxygen partial pressure of $Cu-Cu_2O$ to co-fire the ceramic thin-layer body and the conductive film. Thus, even when the ceramic thin-layer body and the conductive film containing Cu as its main constituent are subjected to co-firing in the firing atmosphere at lower than or equal to the equilibrium oxygen partial pressure of $Cu-Cu_2O$, a highly-reliable ceramic electronic component with favorable insulation properties can be obtained without reducing Fe.

DETAILED DESCRIPTION

Next, an embodiment of the present disclosure will be described in detail.

A ferrite ceramic composition as an embodiment of the present disclosure has a spinel-type crystal structure represented by the general formula $X_2O_2 \cdot MeO$, and contains at least $Fe_2O_3$ and $Mn_2O_3$ as trivalent element compounds, and CuO, ZnO, MgO, and NiO as divalent element compounds.

Figure 1:
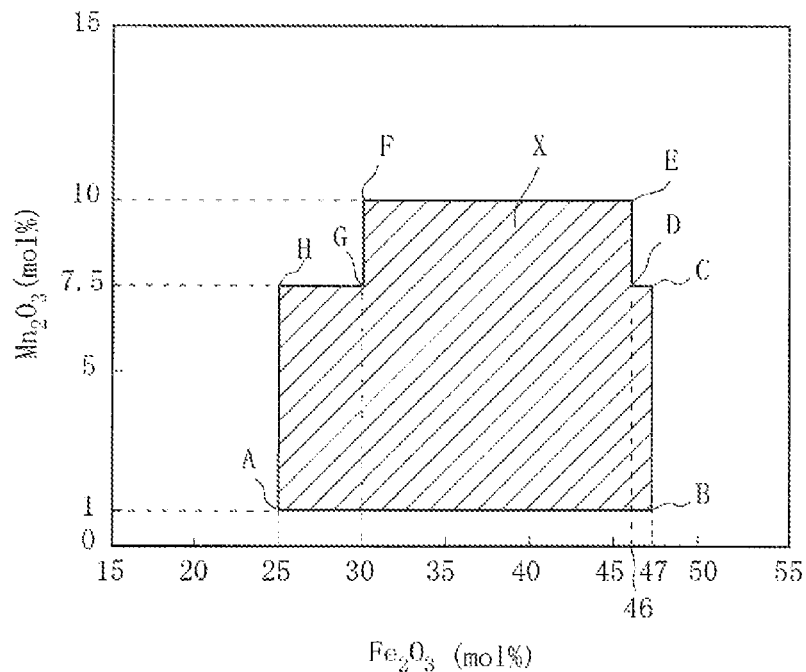
FIG. 1 is a diagram showing the composition range for $Fe_2O_3$ and $Mn_2O_2$ of a ferrite ceramic composition according to the present disclosure.

Specifically, in the ferrite ceramic composition, when the molar content of Fe in terms of $Fe_2O_3$ and the molar content of Mn in terms of $Mn_2O_3$ are represented respectively by x mol % and y mol %, (x, y) has the region of a shaded area X surrounded by the following A through H as shown in FIG. 1. The molar content of Cu is 0.5 to 10.0 mol % in terms of CuO, the molar content of Zn is 1.0 to 35.0 mol % in terms of ZnO, the molar content of Mg is 5.0 to 35.0 mol % in terms of MgO, and the balance is a Ni oxide.

In this case, the respective points (x, y) at points A to H indicate the following molar contents.

A (25, 1), B (47, 1), C (47, 7.5), D (46, 7.5), E (46, 10), F (30, 10), G (30, 7.5), and H (25, 7.5) Next, the reasons that the molar contents of Fe, Mn, Cu, Zn, and Mg fall within the ranges mentioned above in terms of $Fe_2O_3$, $Mn_2O_3$, CuO, ZnO, and MgO will be described in detail.

(1) Molar Contents of Fe and Mn $Fe_2O_3$ reduced from the stoichiometric composition and $Mn_2O_3$ contained in the form of Fe partially substituted with Mn can avoid a decrease in resistivity ρ, and improve insulation properties.

More specifically, in the case of a spinel-type crystal structure (general formula: $X_2O_3 \cdot MeO$), the ratio between $X_2O_3$ (X: Fe, Mn) and MeO (Me: Ni, Zn, Cu) is 50:50 in accordance with the stoichiometric composition, and $X_2O_3$ and MeO are typically combined to approximately follow the stoichiometric composition.

Further, in the case of co-firing the Cu material containing Cu as its main constituent and the ferrite material, there is a need for firing in a reducing atmosphere in which Cu is not oxidized, because firing in an air atmosphere easily oxidizes Cu to produce $Cu_2O$. On the other hand, there is a need for $Fe_2O_3$ to be subjected to firing in an oxidizing atmosphere, because $Fe_2O_4$ is produced when $Fe_2O_3$ as a main constituent of the ferrite material is subjected to firing in a reducing atmosphere.

However, as described in the section "Problem to be solved by the disclosure", it is known that from the relationship between the equilibrium oxygen partial pressure of Cu—$Cu_2O$ and the equilibrium oxygen partial pressure of $Fe_2O_4$—$Fe_2O_2$, there is no region where Cu and $Fe_2O_3$ coexist in the case of firing at high temperatures of 800° C. or higher.

In the meantime, $Mn_2O_2$ reaches a reducing atmosphere at a higher oxygen partial pressure as compared with $Fe_2O_3$ in a temperature range of 800° C. or higher. Therefore, at an oxygen partial pressure lower than or equal to the equilibrium oxygen partial pressure of Cu—$Cu_2O$, $Mn_2O_2$ reaches a strongly reducing atmosphere as compared with $Fe_2O_3$, and for this reason, $Mn_2O_2$ is preferentially reduced to allow sintering to be completed. More specifically, $Mn_2O_2$ is preferentially reduced as compared with $Fe_2O_3$, thus allowing the firing treatment to be completed before $Fe_2O_3$ is reduced to $Fe_3O_4$.

As described above, while $Fe_2O_3$ is reduced in molar content, $Mn_2O_2$ which is likewise a trivalent element compound is contained in the ferrite ceramic composition, and $Mn_2O_2$ is thereby preferentially reduced even when the Cu material and the ferrite material are subjected to co-firing at lower than or equal to the equilibrium oxygen partial pressure of Cu—$Cu_2O$, thus allowing sintering to be completed before $Fe_2O_3$ is reduced, and allowing for more effective coexistence of the Cu metal and $Fe_2O_3$. Thus, this coexistence can avoid a decrease in resistivity ρ, and improve the insulation properties.

However, when the molar content of Fe is less than 25 mol % in terms of $Fe_2O_3$, the molar content of Fe is excessively decreased to cause a decrease in resistivity ρ in turn, thereby making it impossible to ensure desired insulation properties.

In addition, when the molar content of Mn is less than 1 mol % in terms of $Mn_2O_2$, the molar content of Mn is excessively decreased, and $Fe_2O_3$ is thus likely to be reduced to $Fe_2O_4$ to decrease the resistivity ρ, thereby making it impossible to ensure sufficient insulation properties.

In addition, when the molar content of Fe is greater than 47 mol % in terms of $Fe_2O_3$, the molar content of Fe is excessively increased, and $Fe_2O_3$ is likely to be reduced to $Fe_2O_4$ to decrease the resistivity ρ, thereby making it impossible to ensure sufficient insulation properties.

In addition, when the molar content of Mn is greater than 10 mol % in terms of $Mn_2O_2$, it is impossible to achieve adequately high resistivity ρ, or ensure insulation properties.

Moreover, when the molar content of Fe is 25 mol % or more, but less than 30 mol % in terms of $Fe_2O_3$, and when the molar content of Fe is 46 mol % or more, but less than 47 mol % in terms of $Fe_2O_3$, the molar content of Mn in excess of 7.5 mol % in terms of $Mn_2O_2$ in turn causes a decrease in resistivity ρ, thereby making it impossible to ensure desired insulation properties.

Therefore, in the present embodiment, the combination amounts are adjusted so that the respective molar contents of Fe and Mn fall within the region surrounded by the points A through H in FIG. 1 in terms of $Fe_2O_3$ and $Mn_2O_2$.

(2) Molar Content of Cu

The Ni—Cu—Zn ferrite, which contains CuO with a low melting point of 1026° C., makes firing at lower temperatures possible, which can improve sinterability. Further, to that end, there is a need for at least 0.5 mol % or more of Cu to be contained in terms of CuO.

On the other hand, in the case of co-firing the Cu material containing Cu as its main constituent and the ferrite material, there is a need for firing in such a reducing atmosphere in which Cu is not oxidized, because firing in an air atmosphere easily oxidizes Cu to produce $Cu_2O$.

However, in the case of firing in such a reducing atmosphere, the molar content of Cu in excess of 10.0 mol % in terms of CuO reduces CuO in the ferrite raw material to increase the production of $Cu_2O$, thereby possibly leading to a decrease in resistivity ρ.

Thus, in the present embodiment, the combination amount is adjusted so that the molar content of Cu is 0.5 to 10.0 mol % in terms of CuO.

(3) Molar Content of Zn

Although ZnO as a Zn oxide has the effect of contributing to the improved magnetic permeability of the ferrite ceramic composition, there is a need for at least 1.0 mol % or more of Zn to be contained in terms of ZnO in order to produce the effect. In addition, with the molar content of Zn less than 1.0 mol % in terms of ZnO, sinterability is unfavorably decreased to increase the water absorption rate, when firing is carried out in a reducing atmosphere at lower than or equal to the equilibrium oxygen partial pressure of $Cu$—$Cu_2O$.

On the other hand, with the molar content of Zn in excess of 35 mol % in terms of ZnO, there is a possibility that the Curie point Tc will be decreased to fail to guarantee performance at high temperatures.

Thus, in the present embodiment, the combination amount is adjusted so that the molar content of Zn is 1.0 to 35.0 mol % in terms of ZnO.

(4) Molar Content of Mg

The molar content of NiO can be reduced by substituting expensive NiO with relatively inexpensive MgO, thus allowing the reduction in cost. In addition, the stress dependence of the coil component can be reduced by substituting some of NiO that has a large magnetostriction constant with MgO that has a small magnetostriction constant. Further, in order to achieve the effect, the molar content of Mg needs to be at least 5.0 mol % or more in terms of MgO.

However, with the molar content of Mg in excess of 35.0 mol % in terms of MgO, sinterability is unfavorably decreased to cause an increase in water absorption rate in the case of firing in a reducing atmosphere at lower than or equal to the equilibrium oxygen partial pressure of $Cu$—$Cu_2O$.

Thus, in the present embodiment, the combination amount is adjusted so that the molar content of Mg is 5.0 to 35.0 mol % in terms of MgO.

As just described, in the ferrite ceramic composition, when the molar content x mol % of Fe in terms of $Fe_2O_3$ and the molar content y mol % of Mn in terms of $Mn_2O_3$ are represented by (x, y), (x, y) has the region surrounded by the specific range mentioned above. The molar content of CuO is 0.5 to 10.0 mol %, the molar content of ZnO is 1.0 to 35.0 mol %, the molar content of MgO is 5.0 to 35.0 mol % and NiO accounts for the balance. Thus, even when the ferrite ceramic composition is subjected to co-firing with a Cu material, a decrease in resistivity ρ can be avoided, and desired insulation properties can be ensured.

Specifically, favorable insulation properties can be achieved with the resistivity ρ of $10^7$ Ω·cm or more. Furthermore, this makes it possible to achieve, at low cost, a desired ceramic electronic component which has favorable electrical properties such as impedance characteristics.

Next, a ceramic electronic component with the use of the ferrite ceramic composition described above will be described in detail.

Figure 2:
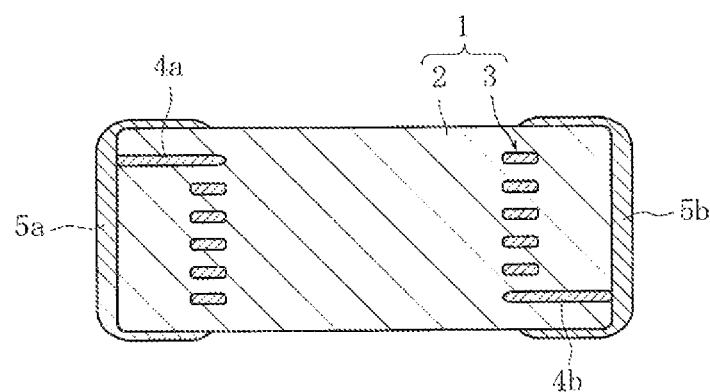
FIG. 2 is a cross-sectional view illustrating an embodiment of a laminated coil component as a ceramic electronic component according to the present disclosure.

FIG. 2 is a cross-sectional view illustrating an embodiment of a laminated coil component as a ceramic electronic component according to the present disclosure.

This laminated coil component has a ferrite body 1 including a magnetic section 2 and a coil conductor (conductive section) 3 containing Cu as its main constituent, which is buried in the magnetic section 2. In addition, extraction electrodes 4a, 4b are formed at both ends of the coil conductor 3, external electrodes 5a, 5b composed of Cu or the like are formed on both ends of the ferrite body 1, and the external electrodes 5a, 5b are electrically connected to the extraction electrodes 4a, 4b.

Figure 3:
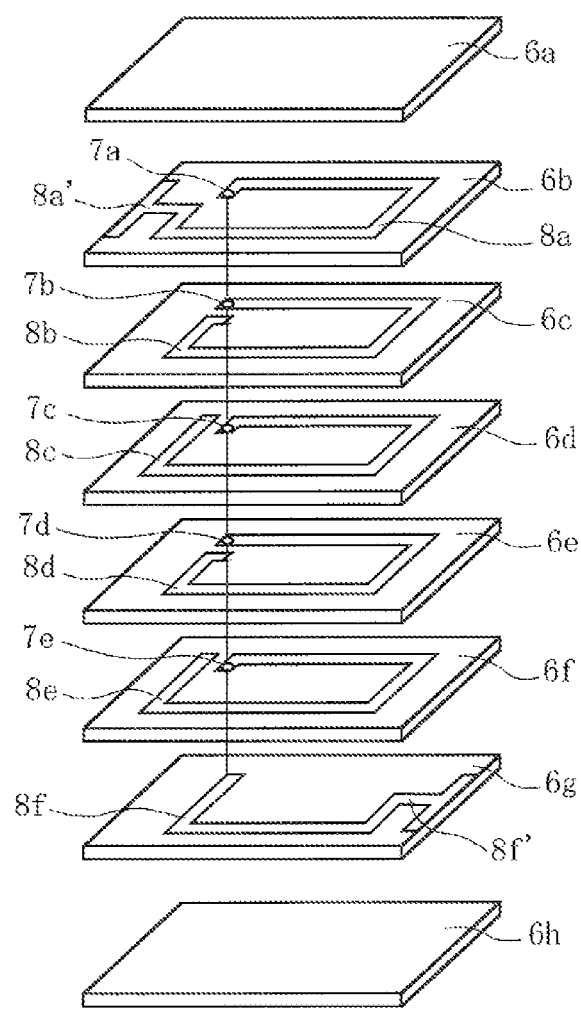
FIG. 3 is an exploded perspective view illustrating a main section of the laminated coil component.

Next, a method for manufacturing the laminated coil component will be described in detail with reference to FIG. 3.

First, a Fe compound such as $Fe_2O_3$, a Mn compound such as $Mn_2O_3$, a Cu compound such as CuO, a Zn compound such as ZnO, a Mg compound such as MgO, and a Ni compound such as NiO were prepared as ceramic raw materials.

Then, the respective ceramic raw materials are weighed so that the molar contents of Fe and Mn meet the specific range surrounded by the points A through H in FIG. 1 in terms of $Fe_2O_3$ and $Mn_2O_3$. The molar content of Cu is 0.5 to 10.0 mol % in terms of CuO, the molar content of Zn is 1.0 to 35.0 mol % in terms of ZnO, the molar content of Mg is 5.0 to 35.0 mol % in terms of MgO, and the balance is a Ni compound.

Then, these weighed compounds were put in a pot mill along with pure water and PSZ (partially stabilized zirconia) balls, and subjected to sufficient mixing and grinding in a wet way, and subjected to evaporative drying, and then to calcination at a temperature of 700 to 800° C. for a predetermined period of time.

Then, these calcined products were put again in a pot mill along with an organic binder such as polyvinyl butyral, an organic solvent such as ethanol and toluene, and PSZ balls, and subjected to sufficient mixing and grinding to prepare ceramic slurry.

Next, the ceramic slurry is subjected to a forming process into the shape of a sheet with the use of a doctor blade method or the like to prepare magnetic ceramic green sheets (ceramic thin-layer body; hereinafter, simply referred to as "magnetic sheets") 6a to 6h with a predetermined film thickness.

Then, a laser processing machine is used to form via holes in predetermined positions of the magnetic sheets 6b to 6g so that the magnetic sheets 6b to 6g are able to be electrically connected to each other.

Next, a conductive paste for coil conductors (hereinafter, referred to as a "Cu paste") is prepared which contains Cu as its main constituent. Then, screen printing is carried out with the use of the Cu paste to form coil patterns 8a to 8f on the magnetic sheets 6b to 6g, and the via holes are filled with the Cu paste to prepare via hole conductors 7a to 7e. Further, extracted parts 8a', 8f' are formed on the respective coil patterns 8a, 8f formed on the magnetic sheet 6b and the magnetic sheet 6g, so as to allow electrical connections to external electrodes.

Then, the magnetic sheets 6b to 6g with the coil patterns 8a to 8f formed thereon are stacked, sandwiched between the magnetic sheet 6a and magnetic sheet 6h with no coil pattern formed, and subjected to pressure bonding, thereby preparing a pressure-bonded block with the coil patterns 8a to 8f connected through the via hole conductors 7a to 7e. Thereafter, this pressure-bonded block is cut into a predetermined size to prepare a laminated compact.

Next, this laminated compact is sufficiently degreased by heating under an atmosphere in which Cu is not oxidized, then supplied to a firing furnace with an atmosphere therein adjusted with a mixed gas of $N_2$—$H_2$—$H_2O$ so as to be lower than or equal to the equilibrium oxygen partial pressure of $Cu$—$Cu_2O$, and subjected to firing at 900 to 1050° C. for a predetermined period of time in the firing furnace, thereby providing the ferrite body 1 with the coil conductor 3 buried in the magnetic section 2.

Next, a conductive paste for external electrodes, which contains Cu or the like as its main constituent, is applied onto both ends of the ferrite body 1, dried, and then burned at a temperature of about 900° C. to form the external electrodes 5a, 5b, thereby preparing a laminated coil component.

As just described, the present embodiment includes the calcination step of weighing a Fe compound, a Mn compound, a Cu compound, a Zn compound, a Mg compound, and a Ni compound so that when the molar content x mol % of Fe in terms of $Fe_2O_3$ and the molar content y mol % of Mn in terms of $Mn_2O_2$ are represented by (x, y), (x, y) meets the specific region surrounded by the points A though H mentioned above. The molar content of Cu is 0.5 to 10.0 mol % in terms of CuO, the molar content of Mg is 5.0 to 35.0 mol % in terms of MgO, the molar content of Zn is 1.0 to 35.0 mol % in terms of ZnO, and the balance is the Ni compound, and mixing and then calcining the weighed compounds to prepare a calcined powder. The magnetic sheet preparation step includes preparing the magnetic sheets 6a to 6h from the calcined powder. The conductive film formation step includes applying a Cu paste to the magnetic sheets 6b to 6g to form the coil patterns 8a to 8f (conductive films). The laminated body formation step includes forming a laminated compact by stacking the magnetic sheets 6b to 6g with the coil patterns 8a to 8f formed in a predetermined order. The firing step includes firing the laminated compact in a firing atmosphere at lower than or equal to the equilibrium oxygen partial pressure of $Cu$—$Cu_2O$ to co-fire the magnetic sheets 6a to 6h and the coil patterns 8a to 8f as conductive films. Thus, even when the magnetic sheets 6a to 6h and the conductive films containing Cu as their main constituent are subjected to co-firing in the firing atmosphere at lower than or equal to the equilibrium oxygen partial pressure of $Cu$—$Cu_2O$, a highly-reliable laminated coil component with favorable insulation properties can be obtained at low cost without reducing Fe.

Specifically, a laminated coil component can be achieved which is capable of making an improvement in resistivity ρ to $10^7$ Ω·cm or more, and suitable for noise absorption with high impedance in a specific frequency range. Further, as a result, it becomes possible to achieve a laminated coil component which has high impedance in a specific frequency range, and has mountain-shape impedance characteristics.

Moreover, it becomes possible to avoid migrations as in the case of Ag materials, and thus, a highly reliable laminated coil component can be achieved which is capable of ensuring favorable insulation properties even when the component is left for a long period of time under high humidity.

It is to be noted that the present disclosure is not to be limited to the embodiment described above. For example, while the ceramic green sheets 6a to 6h are prepared from the calcined powder in the embodiment, any ceramic thin-layer body may be adopted, and for example, a magnetic coating film may be formed on a PET film by carrying out a printing process, and a coil pattern or a capacitance pattern as a conductive film may be formed on the magnetic coating film.

In addition, while the coil patterns 8a to 8f are formed by screen printing in the embodiment, the method for preparing the conductive films is also not to be considered particularly limited. The conductive films may be formed by other methods, for example, thin-film formation methods such as sputtering, a transfer method, or a plating method.

In addition, while the laminated coil component has been described in the embodiment, the disclosure can be obviously applied to laminated composite components such as laminated LC components or single-plate coil components.

Next, examples of the present disclosure will be described specifically.

Example 1

$Fe_2O_3$, $Mn_2O_3$, CuO, ZnO, MgO, and NiO were prepared as ceramic raw materials, and the ceramic raw materials were weighed so that the molar contents provided compositions as shown in Tables 1 to 3. More specifically, while ZnO and CuO were respectively fixed at 20 mol % and 1 mol %, the respective ceramic raw materials were weighed in predetermined amounts so that the respective molar contents of $Fe_2O_3$, $Mn_2O_3$, MgO and NiO differed variously.

Then, these weighed materials were put in a pot mill made of vinyl chloride along with pure water and PSZ balls, subjected to sufficient mixing and grinding in a wet way, and to evaporative drying, and then subjected to calcination at a temperature of 750° C. to obtain a calcined powder.

Then, this calcined powder was put again in a pot mill made of vinyl chloride along with a polyvinyl butyral-based binder (organic binder), ethanol (organic solvent), and PSZ balls, and subjected to sufficient mixing and grinding to obtain ceramic slurry.

Next, a doctor blade method was used to form the ceramic slurry into the shape of a sheet to have a thickness of 25 μm, and this sheet was subjected to punching into a size of 50 mm×50 mm to prepare magnetic sheets.

Next, a Cu powder is mixed into an organic vehicle containing terpineol (organic solvent) and ethyl cellulose resin (binder resin), and subjected to kneading with a three-roll mill to prepare a conductive paste (Cu paste) containing Cu as its main constituent.

Then, the Cu paste was applied by screen printing onto surfaces of the magnetic sheets to prepare conductive films in predetermined patterns. Then, the magnetic sheets with the conductive films formed were stacked for a predetermined number of sheets in predetermined order, sandwiched between the magnetic sheets with no conductive films formed, subjected to pressure bonding, and cut into a predetermined size to obtain a laminated compact.

Then, the laminated compact obtained was degreased by sufficient heating under a reducing atmosphere in which Cu was not oxidized, and a mixed gas of $N_2$—$H_2$—$H_2O$ was then supplied to a firing furnace to adjust the oxygen partial pressure to $6.7 \times 10^{-2}$ Pa. Then, the laminated compact was supplied to the firing furnace, and subjected to firing for 2 hours at a temperature of 1000° C. to obtain a ceramic sintered body with internal electrodes buried therein.

It is to be noted that the oxygen partial pressure: $6.7 \times 10^{-2}$ Pa is the equilibrium oxygen partial pressure of $Cu$—$Cu_2O$ at 1000° C., which means that the laminated compact is subjected to firing for 2 hours at the equilibrium oxygen partial pressure of $Cu$—$Cu_2O$, thereby providing a ceramic sintered body.

Then, this ceramic sintered body was put in a pot along with water, and subjected to barrel processing with the use of a centrifugal barrel machine to obtain a ceramic body.

Thereafter, a Cu paste for external electrodes was applied onto both ends of the ceramic body, and subjected to a burning treatment at a temperature of 900° C. in a firing furnace with the oxygen partial pressure adjusted to $4.3 \times 10^{-3}$ Pa, thereby preparing samples of sample numbers 1 to 72 for resistivity measurement. It is to be noted that the oxygen partial pressure: $4.3 \times 10^{-3}$ Pa is the equilibrium oxygen partial pressure of $Cu$—$Cu_2O$ at a temperature of 900° C.

The external dimensions of the samples for resistivity measurement were 3.0 mm in length, 3.0 mm in width, and 1.0 mm in thickness.

Figure 4:
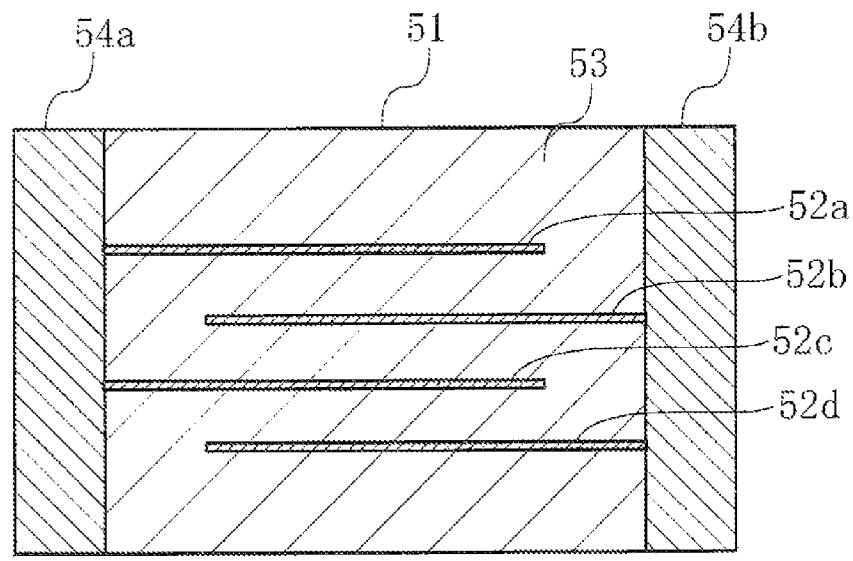
FIG. 4 is a cross-sectional view of a sample for resistivity measurement, prepared in Example 1.

FIG. 4 is a cross-sectional view of a sample for resistivity measurement, where internal electrodes 52a to 52d are buried in a magnetic layer 53 so as to alternate extracted parts in a ceramic body 51, and external electrodes 54a, 54b are formed on both end surfaces of the ceramic body 51.

Next, for the samples of sample numbers 1 to 72 for resistivity measurement, a voltage of 50 V was applied for 30 seconds to the external electrodes 54a, 54b to measure the current during the voltage application. Then, the resistance was calculated from the measurement value, and the logarithm log ρ of the resistivity (hereinafter, referred to as "resistivity log ρ") was calculated from the sample dimensions.

Tables 1 to 3 show the ferrite compositions and measurement results for sample numbers 1 to 72.

TABLE 1

| Sample Number | Ferrite Composition (mol %) | | | | | | Resistivity log ρ (ρ: Ω · cm) |
|---|---|---|---|---|---|---|---|
| | $Fe_2O_3$ | $Mn_2O_3$ | CuO | ZnO | MgO | NiO | |
| 1* | 48.0 | 0.0 | 1.0 | 20.0 | 20.7 | 10.3 | 4.6 |
| 2* | 48.0 | 1.0 | 1.0 | 20.0 | 20.0 | 10.0 | 6.1 |
| 3* | 48.0 | 2.0 | 1.0 | 20.0 | 19.3 | 9.7 | 6.5 |
| 4* | 48.0 | 5.0 | 1.0 | 20.0 | 17.3 | 8.7 | 6.3 |
| 5* | 48.0 | 7.5 | 1.0 | 20.0 | 15.7 | 7.8 | 6.1 |
| 6* | 48.0 | 10.0 | 1.0 | 20.0 | 14.0 | 7.0 | 5.8 |
| 7* | 48.0 | 13.0 | 1.0 | 20.0 | 12.0 | 6.0 | 5.2 |
| 8* | 48.0 | 15.0 | 1.0 | 20.0 | 10.7 | 5.3 | 4.5 |
| 9* | 47.0 | 0.0 | 1.0 | 20.0 | 21.3 | 10.7 | 5.6 |
| 10 | 47.0 | 1.0 | 1.0 | 20.0 | 20.7 | 10.3 | 7.3 |
| 11 | 47.0 | 2.0 | 1.0 | 20.0 | 20.0 | 10.0 | 7.8 |
| 12 | 47.0 | 5.0 | 1.0 | 20.0 | 18.0 | 9.0 | 7.6 |
| 13 | 47.0 | 7.5 | 1.0 | 20.0 | 16.3 | 8.2 | 7.3 |
| 14* | 47.0 | 10.0 | 1.0 | 20.0 | 14.7 | 7.3 | 6.7 |
| 15* | 47.0 | 13.0 | 1.0 | 20.0 | 12.7 | 6.3 | 5.9 |
| 16* | 47.0 | 15.0 | 1.0 | 20.0 | 11.3 | 5.7 | 5.2 |
| 17* | 46.0 | 0.0 | 1.0 | 20.0 | 22.0 | 11.0 | 6.2 |
| 18 | 46.0 | 1.0 | 1.0 | 20.0 | 21.3 | 10.7 | 7.7 |
| 19 | 46.0 | 2.0 | 1.0 | 20.0 | 20.7 | 10.3 | 7.9 |
| 20 | 46.0 | 5.0 | 1.0 | 20.0 | 18.7 | 9.3 | 7.8 |
| 21 | 46.0 | 7.5 | 1.0 | 20.0 | 17.0 | 8.5 | 7.6 |
| 22 | 46.0 | 10.0 | 1.0 | 20.0 | 15.3 | 7.7 | 7.1 |
| 23* | 46.0 | 13.0 | 1.0 | 20.0 | 13.3 | 6.7 | 6.3 |
| 24* | 46.0 | 15.0 | 1.0 | 20.0 | 12.0 | 6.0 | 5.5 |
| 25* | 45.0 | 0.0 | 1.0 | 20.0 | 22.7 | 11.3 | 6.6 |
| 26 | 45.0 | 1.0 | 1.0 | 20.0 | 22.0 | 11.0 | 8.1 |
| 27 | 45.0 | 2.0 | 1.0 | 20.0 | 21.3 | 10.7 | 8.3 |
| 28 | 45.0 | 5.0 | 1.0 | 20.0 | 19.3 | 9.7 | 8.2 |
| 29 | 45.0 | 7.5 | 1.0 | 20.0 | 17.7 | 8.8 | 8.0 |
| 30 | 45.0 | 10.0 | 1.0 | 20.0 | 16.0 | 8.0 | 7.5 |

*outside the scope of the present disclosure

TABLE 2

| Sample Number | Ferrite Composition (mol %) | | | | | | Resistivity log ρ (ρ: Ω · cm) |
|---|---|---|---|---|---|---|---|
| | $Fe_2O_3$ | $Mn_2O_3$ | CuO | ZnO | MgO | NiO | |
| 31* | 45.0 | 13.0 | 1.0 | 20.0 | 14.0 | 7.0 | 6.7 |
| 32* | 45.0 | 15.0 | 1.0 | 20.0 | 12.7 | 6.3 | 5.8 |
| 33* | 40.0 | 0.0 | 1.0 | 20.0 | 26.0 | 13.0 | 6.9 |
| 34 | 40.0 | 1.0 | 1.0 | 20.0 | 25.3 | 12.7 | 8.3 |
| 35 | 40.0 | 2.0 | 1.0 | 20.0 | 24.7 | 12.3 | 8.4 |
| 36 | 40.0 | 5.0 | 1.0 | 20.0 | 22.7 | 11.3 | 8.4 |
| 37 | 40.0 | 7.5 | 1.0 | 20.0 | 21.0 | 10.5 | 8.2 |
| 38 | 40.0 | 10.0 | 1.0 | 20.0 | 19.3 | 9.7 | 7.7 |
| 39* | 40.0 | 13.0 | 1.0 | 20.0 | 17.3 | 8.7 | 6.9 |
| 40* | 40.0 | 15.0 | 1.0 | 20.0 | 16.0 | 8.0 | 6.2 |
| 41* | 35.0 | 0.0 | 1.0 | 20.0 | 29.3 | 14.7 | 6.4 |
| 42 | 35.0 | 1.0 | 1.0 | 20.0 | 28.7 | 14.3 | 8.0 |
| 43 | 35.0 | 2.0 | 1.0 | 20.0 | 28.0 | 14.0 | 8.3 |
| 44 | 35.0 | 5.0 | 1.0 | 20.0 | 26.0 | 13.0 | 8.3 |
| 45 | 35.0 | 7.5 | 1.0 | 20.0 | 24.3 | 12.2 | 7.8 |
| 46 | 35.0 | 10.0 | 1.0 | 20.0 | 22.7 | 11.3 | 7.3 |
| 47* | 35.0 | 13.0 | 1.0 | 20.0 | 20.7 | 10.3 | 6.5 |
| 48* | 35.0 | 15.0 | 1.0 | 20.0 | 19.3 | 9.7 | 6.0 |
| 49* | 30.0 | 0.0 | 1.0 | 20.0 | 32.7 | 16.3 | 6.0 |
| 50 | 30.0 | 1.0 | 1.0 | 20.0 | 32.0 | 16.0 | 7.6 |
| 51 | 30.0 | 2.0 | 1.0 | 20.0 | 31.3 | 15.7 | 8.0 |
| 52 | 30.0 | 5.0 | 1.0 | 20.0 | 29.3 | 14.7 | 7.7 |
| 53 | 30.0 | 7.5 | 1.0 | 20.0 | 27.7 | 13.8 | 7.4 |
| 54 | 30.0 | 10.0 | 1.0 | 20.0 | 26.0 | 13.0 | 7.0 |
| 55* | 30.0 | 13.0 | 1.0 | 20.0 | 24.0 | 12.0 | 6.3 |
| 56* | 30.0 | 15.0 | 1.0 | 20.0 | 22.7 | 11.3 | 5.6 |
| 57* | 25.0 | 0.0 | 1.0 | 20.0 | 36.0 | 18.0 | 5.5 |
| 58 | 25.0 | 1.0 | 1.0 | 20.0 | 35.0 | 17.7 | 7.3 |
| 59 | 25.0 | 2.0 | 1.0 | 20.0 | 34.7 | 17.3 | 7.6 |
| 60 | 25.0 | 5.0 | 1.0 | 20.0 | 32.7 | 16.3 | 7.4 |

*outside the scope of the present disclosure

TABLE 3

| Sample Number | Ferrite Composition (mol %) | | | | | | Resistivity log ρ (ρ: Ω · cm) |
|---|---|---|---|---|---|---|---|
| | $Fe_2O_3$ | $Mn_2O_3$ | CuO | ZnO | MgO | NiO | |
| 61 | 25.0 | 7.5 | 1.0 | 20.0 | 31.0 | 15.5 | 7.3 |
| 62* | 25.0 | 10.0 | 1.0 | 20.0 | 29.3 | 14.7 | 6.7 |
| 63* | 25.0 | 13.0 | 1.0 | 20.0 | 27.3 | 13.7 | 5.9 |
| 64* | 25.0 | 15.0 | 1.0 | 20.0 | 26.0 | 13.0 | 5.2 |
| 65* | 20.0 | 0.0 | 1.0 | 20.0 | 39.3 | 19.7 | 4.8 |
| 66* | 20.0 | 1.0 | 1.0 | 20.0 | 38.7 | 19.3 | 6.4 |
| 67* | 20.0 | 2.0 | 1.0 | 20.0 | 38.0 | 19.0 | 6.9 |
| 68* | 20.0 | 5.0 | 1.0 | 20.0 | 36.0 | 18.0 | 6.5 |
| 69* | 20.0 | 7.5 | 1.0 | 20.0 | 34.3 | 17.2 | 6.1 |
| 70* | 20.0 | 10.0 | 1.0 | 20.0 | 32.7 | 16.3 | 5.8 |
| 71* | 20.0 | 13.0 | 1.0 | 20.0 | 30.7 | 15.3 | 5.2 |
| 72* | 20.0 | 15.0 | 1.0 | 20.0 | 29.3 | 14.7 | 4.6 |

*outside the scope of the present disclosure

Sample numbers 1 to 9, 14 to 17, 23 to 25, 31 to 33, 39 to 41, 47 to 49, 55 to 57, and 62 to 72 fall outside the shaded area X in FIG. 1, thus resulting in small resistivity log ρ with the resistivity log ρ less than 7, and failing to achieve desired insulation properties.

In contrast, it has been determined that sample numbers 10 to 13, 18 to 22, 26 to 30, 34 to 38, 42 to 46, 50 to 54, and 58 to 61 fall within the region surrounded by the shaded area X in FIG. 1, thus resulting in resistivity log ρ of 7 or more, and achieving favorable insulation properties.

Example 2

The ceramic raw materials were weighed so that the respective molar contents of $Fe_2O_3$, $Mn_2O_3$, ZnO, and MgO fell within the scope of the present disclosure, the molar content of CuO differed variously, and the balance was NiO, as shown in Table 4. Further, samples of sample numbers 101 to 111 for resistivity measurement were prepared by the same method and procedure as in Example 1 except for the above.

Then, for sample numbers 101 to 111, the resistivity log ρ was measured by the same method and procedure as in Example 1.

Table 4 shows the ferrite compositions and measurement results for sample numbers 101 to 111.

TABLE 4

| Sample Number | Ferrite Composition (mol %) | | | | | | Resistivity log ρ (ρ: Ω·cm) |
|---|---|---|---|---|---|---|---|
| | $Fe_2O_3$ | $Mn_2O_3$ | CuO | ZnO | MgO | NiO | |
| 101* | 44.0 | 5.0 | 0.0 | 20.0 | 20.7 | 10.3 | 5.5 |
| 102* | 44.0 | 5.0 | 0.25 | 20.0 | 20.5 | 10.25 | 6.3 |
| 103 | 44.0 | 5.0 | 0.5 | 20.0 | 20.3 | 10.2 | 7.4 |
| 104 | 44.0 | 5.0 | 2.0 | 20.0 | 19.3 | 9.7 | 8.1 |
| 105 | 44.0 | 5.0 | 4.0 | 20.0 | 18.0 | 9.0 | 7.9 |
| 106 | 44.0 | 5.0 | 6.0 | 20.0 | 16.7 | 8.3 | 7.6 |
| 107 | 44.0 | 5.0 | 8.0 | 20.0 | 15.3 | 7.7 | 7.3 |
| 108 | 44.0 | 5.0 | 10.0 | 20.0 | 14.0 | 7.0 | 7.0 |
| 109* | 44.0 | 5.0 | 13.0 | 20.0 | 12.0 | 6.0 | 6.5 |
| 110* | 44.0 | 5.0 | 15.0 | 20.0 | 10.7 | 5.3 | 6.1 |
| 111* | 44.0 | 5.0 | 20.0 | 20.0 | 7.3 | 3.7 | 5.3 |

*outside the scope of the present disclosure

Sample numbers 101 and 102, because of the CuO molar content less than 0.5 mol %, have decreased sinterability, thereby failing to be sufficiently sintered at the firing temperature of 1000° C., and for this reason, undergo a decrease in resistivity log ρ to less than 7, thereby failing to achieve desired insulation properties.

On the other hand, sample numbers 109 to 111, because of the CuO molar content in excess of 10.0 mol %, have $Cu_2O$ produced through the reduction of CuO, and for this reason, undergo a decrease in resistivity log ρ to less than 7, thereby failing to achieve desired insulation properties.

In contrast, sample numbers 103 to 108 with the CuO molar content from 0.5 to 10.0 mol % fall within the scope of the present disclosure, thus resulting in resistivity log ρ of or more, and thereby achieving favorable insulation properties.

Example 3

The ceramic raw materials were weighed so that the respective molar contents of $Fe_2O_3$, $Mn_2O_2$, CuO, and ZnO fell within the scope of the present disclosure, the molar content of MgO differed variously, and the balance was NiO, as shown in Table 5. Further, samples of sample numbers 201 to 208 for resistivity measurement were prepared by the same method and procedure as in Example 1 except for the above.

Then, for sample numbers 201 to 208, the resistivity log ρ was measured by the same method and procedure as in Example 1.

Table 5 shows the ferrite compositions and measurement results for sample numbers 201 to 208.

TABLE 5

| Sample Number | Ferrite Composition (mol %) | | | | | | Resistivity log ρ (ρ: Ω·cm) |
|---|---|---|---|---|---|---|---|
| | $Fe_2O_3$ | $Mn_2O_3$ | CuO | ZnO | MgO | NiO | |
| 201 | 44.0 | 5.0 | 1.0 | 5.0 | 5.0 | 40.0 | 7.8 |
| 202 | 44.0 | 5.0 | 1.0 | 5.0 | 10.0 | 35.0 | 7.6 |
| 203 | 44.0 | 5.0 | 1.0 | 5.0 | 15.0 | 30.0 | 7.4 |
| 204 | 44.0 | 5.0 | 1.0 | 5.0 | 20.0 | 25.0 | 7.3 |
| 205 | 44.0 | 5.0 | 1.0 | 5.0 | 25.0 | 20.0 | 7.2 |
| 206 | 44.0 | 5.0 | 1.0 | 5.0 | 30.0 | 15.0 | 7.2 |
| 207 | 44.0 | 5.0 | 1.0 | 5.0 | 35.0 | 10.0 | 7.2 |
| *208 | 44.0 | 5.0 | 1.0 | 5.0 | 40.0 | 5.0 | — |

*outside the scope of the present disclosure

Sample number 208, because of the MgO molar content of 40.0 mol % in excess of 35.0 mol %, undergoes a decrease in sinterability, and an increase in water absorption rate of 0.1% or more in the case of firing at the equilibrium oxygen partial pressure of $Cu$—$Cu_2O$, thereby failing to accurately measure the resistivity log ρ.

In contrast, sample numbers 201 to 207 have the MgO molar content from 5.0 to 35.0 mol % within the scope of the present disclosure, and also have the molar contents of $Fe_2O_3$, $Mn_2O_3$, and CuO within the scope of the present disclosure, thus resulting in resistivity log ρ of 7 or more, and thereby achieving favorable insulation properties.

Further, it has been separately confirmed that when the molar content of MgO is less than 5.0 mol %, the effect of adequately reducing the magnetostriction constant is not produced unfavorably.

Therefore, it has been determined that the molar content of MgO needs to be 5.0 to 35.0 mol %.

Example 4

The ceramic raw materials were weighed so that the respective molar contents of $Fe_2O_3$, $Mn_2O_3$, CuO, and MgO fell within the scope of the present disclosure. The molar content of ZnO differed variously. The balance was NiO, as shown in Table 6. Further, samples of sample numbers 211 to 219, for resistivity measurement, were prepared by the same method and procedure as in Example 1 except for the above.

In addition, ring-shaped samples were prepared separately for measuring the Curie point Tc.

More specifically, the multiple magnetic sheets obtained by the same method and procedure as in Example 1 were stacked to have a thickness of 1.0 mm in total, heated to 60° C., subjected to pressure bonding by applying a pressure of 100 MPa for 60 seconds, and then cut out into a ring shape of 20 mm in outside diameter and 12 mm in inside diameter to obtain a laminated compact.

Then, the laminated compact obtained was sufficiently degreased by heating the compact under such a reducing atmosphere in which Cu was not oxidized. Then, a mixed gas of $N_2$—$H_2$—$H_2O$ was supplied to a firing furnace to adjust the oxygen partial pressure to $6.7 \times 10^{-2}$ Pa, and the ceramic compact was supplied to the firing furnace, and subjected to firing for 2 hours at a temperature of 1000° C., thereby providing ring-shaped samples of sample numbers 211 to 219.

Next, for each ring-shaped sample of sample numbers 211 to 219, an annealed copper wire was wound around the sample to reach 20 turns, and a magnetic field of 1 T (tesla) was applied to the sample with the use of a vibrating sample magnetometer (Type VSM-5-15 from Toei Industry Co., Ltd.) to measure the temperature dependence of saturation magnetization. Then, the Curie point Tc was figured out from the temperature dependence of saturation magnetization.

Table 6 shows the ferrite compositions and measurement results for sample numbers 211 to 219.

TABLE 6

| Sample Number | Ferrite Composition (mol %) | | | | | | Resistivity log ρ (ρ: Ω·cm) | Curie Point Tc (° C.) |
|---|---|---|---|---|---|---|---|---|
| | $Fe_2O_3$ | $Mn_2O_3$ | CuO | ZnO | MgO | NiO | | |
| *211 | 44.0 | 5.0 | 1.0 | 38.0 | 2.0 | 10.0 | 9.1 | 90 |
| 212 | 44.0 | 5.0 | 1.0 | 35.0 | 5.0 | 10.0 | 9.0 | 115 |
| 213 | 44.0 | 5.0 | 1.0 | 25.0 | 5.0 | 20.0 | 8.6 | 235 |
| 214 | 44.0 | 5.0 | 1.0 | 20.0 | 10.0 | 20.0 | 8.4 | 270 |
| 215 | 44.0 | 5.0 | 1.0 | 15.0 | 15.0 | 20.0 | 8.0 | 307 |
| 216 | 44.0 | 5.0 | 1.0 | 10.0 | 20.0 | 20.0 | 7.6 | 346 |
| 217 | 44.0 | 5.0 | 1.0 | 5.0 | 25.0 | 20.0 | 7.2 | 391 |
| 218 | 44.0 | 5.0 | 1.0 | 1.0 | 29.0 | 20.0 | 7.1 | 405 |
| *219 | 44.0 | 5.0 | 1.0 | 0.0 | 30.0 | 20.0 | — | — |

*outside the scope of the present disclosure

Sample number 211, because of the ZnO molar content of 38.0 mol % in excess of 35.0 mol %, underwent a decrease in Curie point Tc down to 90° C., in spite of favorable resistivity log ρ of 9.1.

On the other hand, sample number 219, because of the ZnO molar content of zero, underwent a decrease in sinterability, and also an increase in water absorption rate to 0.1% or more in the case of firing at the equilibrium oxygen partial pressure of Cu—$Cu_2O$, thereby failing to accurately measure the resistivity log ρ and the Curie point Tc.

In contrast, it has been determined that sample numbers 212 to 218, because of the ZnO molar content of 5.0 to 35.0 mol %, achieves favorable results: Curie point Tc of 115° C. or higher, and also resistivity log ρ of 7 or more.

Example 5

Prepared were the magnetic sheets of sample number 28 ($Fe_2O_3$: 45.0 mol %, $Mn_2O_3$: 5.0 mol %, CuO: 1.0 mol %, ZnO: 20.0 mol %, MgO: 19.3 mol %, NiO: 9.7 mol %) and sample number 25 ($Fe_2O_3$: 45.0 mol %, $Mn_2O_3$: 0.0 mol %, CuO: 1.0 mol %, ZnO: 20.0 mol %, MgO: 22.7 mol %, NiO: 11.3 mol %), which were prepared according to Example 1.

Then, after a laser processing machine was used to form via holes in predetermined positions of the magnetic sheets, the Cu paste prepared according to Example 1 was applied by screen printing onto surfaces of the magnetic sheets, and the via holes were filled with the Cu paste, thereby forming coil patterns in predetermined shapes and via conductors.

Then, the magnetic sheets with the coil patterns formed were stacked, then sandwiched between the magnetic sheets with no coil patterns formed, heated to 60° C., subjected to pressure bonding by applying a pressure of 100 MPa for 60 seconds, and cut into a predetermined size, thereby preparing a ferrite body with a coil conductor buried in a magnetic section.

Next, after sufficient degreasing by heating under an atmosphere in which Cu was not oxidized, the ferrite body was supplied to a firing furnace with the oxygen partial pressure adjusted to $6.7 \times 10^{-2}$ Pa with a mixed gas of $N_2$—$H_2$—$H_2O$, and subjected to firing for 2 hours at a temperature of 1000° C. to obtain a component body.

Next, the same Cu paste for external electrodes as in Example 1 was prepared, and this Cu paste for external electrodes was applied onto both ends of the component body, dried, and then burned at 900° C. in a firing furnace with the oxygen partial pressure adjusted to $4.3 \times 10^{-3}$ Pa to form external electrodes, thereby preparing samples of sample numbers 28', 25'. It is to be noted that the oxygen partial pressure of $4.3 \times 10^{-3}$ Pa is the equilibrium oxygen partial pressure of Cu—$Cu_2O$ at 900° C.

The respective samples of sample numbers 28', 25' had external dimensions of length: 1.6 mm, width: 0.8 mm, and thickness: 0.8 mm, and the number of turns in a coil was 9.5.

Next, for each sample of sample numbers 28', 25', an impedance analyzer (HP4291A from Agilent Technologies Inc.) was used to measure impedance characteristics.

Figure 5:
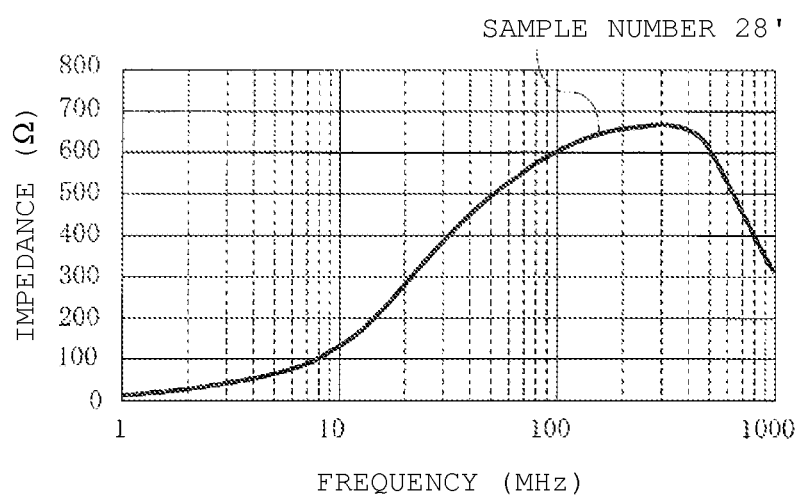
FIG. 5 is a diagram showing impedance characteristics of a sample according to the present disclosure, prepared in Example 2.
Figure 6:
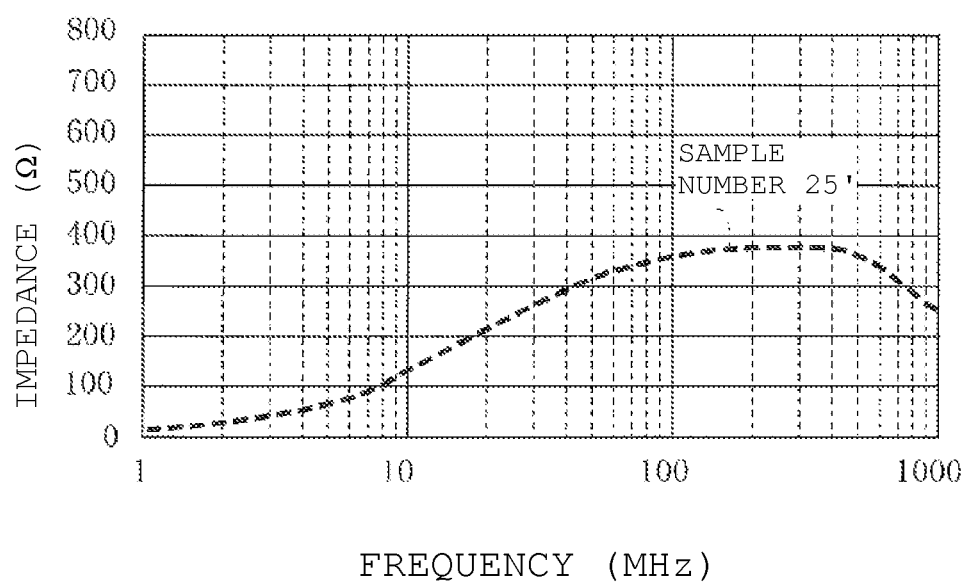
FIG. 6 is a diagram showing impedance characteristics of a sample according to a comparative example, prepared in Example 2.

FIG. 5 shows impedance characteristics for sample number 28', whereas FIG. 6 shows impedance characteristics for sample number 25'. The horizontal axis indicates a frequency (MHz), whereas the vertical axis indicates an impedance (Ω).

Sample number 25', because of the composition outside the scope of the present disclosure, has a small resistivity log ρ of 6.6, and as a result, has impedance on the order of about 400Ω at a maximum as shown in FIG. 6, thereby failing to achieve the desired high impedance.

In contrast, sample number 28' has a composition within the scope of the present disclosure, and adequately large resistivity log ρ of 8.2, and thus, the impedance characteristics also have a remarkable mountain-like shape as shown in FIG. 5. Furthermore, it has been determined that high impedance is achieved in a specific frequency range, with high impedance of about 700Ω achieved at a maximum.

INDUSTRIAL APPLICABILITY

Even when the conductive section and the magnetic section are subjected to co-firing with the use of a material containing Cu as its main constituent for the conductive section, a ceramic electronic component can be achieved such as a coil component which has favorable insulation properties and favorable electric properties.

The invention claimed is:

1. A ceramic electronic component comprising:
a magnetic section including a ferrite material; and
a conductive section containing Cu as a main constituent,
the magnetic section being formed from a ferrite ceramic composition containing at least Fe, Mn, Cu, Zn, Mg, and Ni,
wherein when a molar content x mol % of Fe in terms of $Fe_2O_3$ and a molar content y mol % of Mn in terms of $Mn_2O_3$ are represented by (x, y), the (x, y) falls within a region surrounded by A (25, 1), B (47, 1), C (47, 7.5), D (46, 7.5), E (46, 10), F (30, 10), G (30, 7.5), and H (25, 7.5), a molar content of Cu is 0.5 to 10.0 mol % in terms of CuO, a molar content of Zn is 1.0 to 35.0 mol % in terms of ZnO, and a molar content of Mg is 5.0 to 35.0 mol % in terms of MgO.

2. The ceramic electronic component according to claim 1, wherein the ceramic electronic component is obtained by firing in an atmosphere at lower than or equal to an equilibrium oxygen partial pressure of Cu—$Cu_2O$.

3. The ceramic electronic component according to claim 1, wherein the magnetic section and the conductive section are obtained by co-firing.

4. The ceramic electronic component according to claim 1, wherein the magnetic section and the conductive section are alternately stacked more than once.

5. The ceramic electronic component according to claim 1, wherein the ceramic electronic component is a laminated coil component.

6. A method for manufacturing a ceramic electronic component, the method comprising the steps of:
weighing a Fe compound, a Mn compound, a Cu compound, a Zn compound, a Mg compound, and a Ni compound so that when a molar content x mol % of Fe in terms of $Fe_2O_3$ and a molar content y mol % of Mn in terms of $Mn_2O_3$ are represented by (x, y), the (x, y) includes a region surrounded by A (25, 1), B (47, 1), C (47, 7.5), D (46, 7.5), E (46, 10), F (30, 10), G (30, 7.5), and H (25, 7.5), and a molar content of Cu is 0.5 to 10.0 mol % in terms of CuO, a molar content of Zn is 1.0 to 35.0 mol % in terms of ZnO, and a molar content of Mg is 5.0 to 35.0 mol % in terms of MgO;
mixing and then calcining the weighed compounds to prepare a calcined powder;
preparing a ceramic thin-layer body from the calcined powder;
forming, on the ceramic thin-layer body, a conductive film containing Cu as a main constituent in a predetermined pattern;

forming a laminated body by stacking the ceramic thin-layer body with the conductive film formed in a predetermined order; and firing the laminated body in a firing atmosphere at lower than or equal to an equilibrium oxygen partial pressure of $Cu$—$Cu_2O$ to co-fire the ceramic thin-layer body and the conductive film.

\* \* \* \* \*